United States Patent
You et al.

(10) Patent No.: US 10,043,847 B2
(45) Date of Patent: Aug. 7, 2018

(54) IMAGE CAPTURING MODULE AND ELECTRICAL APPARATUS

(71) Applicant: Gingy Technology Inc., Hsinchu (TW)

(72) Inventors: Kuo-Liang You, Hsinchu (TW); Jen-Chieh Wu, Hsinchu (TW)

(73) Assignee: Gingy Technology Inc., Hsinchu (TW)

( * ) Notice: Subject to any disclaimer, the term of this patent is extended or adjusted under 35 U.S.C. 154(b) by 0 days.

(21) Appl. No.: 15/713,693

(22) Filed: Sep. 24, 2017

(65) Prior Publication Data
US 2018/0075283 A1  Mar. 15, 2018

Related U.S. Application Data

(63) Continuation-in-part of application No. 15/208,619, filed on Jul. 13, 2016, which is a continuation-in-part
(Continued)

(30) Foreign Application Priority Data

Aug. 26, 2014 (TW) .............................. 103129359 A
Dec. 22, 2014 (TW) .............................. 103144744 A
Sep. 26, 2016 (TW) .............................. 105214737 U

(51) Int. Cl.
*H01L 27/14* (2006.01)
*H01L 27/146* (2006.01)
(Continued)

(52) U.S. Cl.
CPC ...... *H01L 27/14678* (2013.01); *G06K 9/0004* (2013.01); *G06K 9/00114* (2013.01);
(Continued)

(58) Field of Classification Search
CPC ............ G06K 9/00114; G06K 9/0004; G06K 2009/0006; G06K 9/00053;
(Continued)

(56) References Cited

U.S. PATENT DOCUMENTS

6,310,683 B1 * 10/2001 Fujiwara .............. G06K 9/0004
250/556
6,330,158 B1 * 12/2001 Akram ................ H01L 23/4334
165/80.3
(Continued)

FOREIGN PATENT DOCUMENTS

CN  106326836  1/2017
CN  206470779  9/2017
(Continued)

*Primary Examiner* — Manav Seth
(74) *Attorney, Agent, or Firm* — JCIPRNET

(57) ABSTRACT

An image capturing module including a substrate, a plurality of light emitting devices, a sensor, and a transparent colloid curing layer is provided. The light emitting devices and the sensor are disposed on the substrate and are respectively electrically connected to the substrate. The transparent colloid curing layer is disposed on the substrate and covers the sensor and the light emitting devices. At least one trench is provided at a side of the transparent colloid curing layer opposite to the sensor. The at least one trench is located between the sensor and the light emitting devices, and a depth of the at least one trench is less than a thickness of the transparent colloid curing layer. An electrical apparatus is also provided.

26 Claims, 6 Drawing Sheets

Related U.S. Application Data of application No. 14/835,130, filed on Aug. 25, 2015, and a continuation-in-part of application No. 14/978,237, filed on Dec. 22, 2015, now Pat. No. 9,770,199.

(60) Provisional application No. 62/486,954, filed on Apr. 18, 2017.

(51) Int. Cl.
*G06K 9/00* (2006.01)
*H01L 21/56* (2006.01)

(52) U.S. Cl.
CPC ........ *H01L 21/56* (2013.01); *H01L 27/14636* (2013.01); *G06K 2009/0006* (2013.01)

(58) Field of Classification Search
CPC .......... G06K 9/00087; H01L 27/14618; H01L 21/56; H01L 23/293; H01L 24/48; H01L 24/73; H01L 24/92; H01L 27/14636; H01L 27/14678; H01L 2224/48225; H01L 2224/73265; H01L 2224/92247
See application file for complete search history.

(56) References Cited

U.S. PATENT DOCUMENTS

| | | | | |
|---|---|---|---|---|
| 7,414,790 B2* | 8/2008 | Raymond | ............ | G02B 3/0025 359/619 |
| 7,479,627 B2* | 1/2009 | Yoshimoto | ........ | H01L 27/14618 250/239 |
| 7,606,400 B2* | 10/2009 | Ryhanen | ............. | G06K 9/0002 324/661 |
| 7,923,298 B2* | 4/2011 | Oliver | ............... | H01L 27/14618 438/114 |
| 8,461,613 B2* | 6/2013 | Chou | .................... | H05B 33/12 257/88 |
| 2003/0232461 A1* | 12/2003 | Bolken | ................. | H01L 23/293 438/106 |
| 2005/0277231 A1* | 12/2005 | Hembree | .............. | H01L 21/563 438/127 |
| 2013/0194236 A1 | 8/2013 | Gu et al. | | |
| 2013/0306947 A1* | 11/2013 | Yamazaki | ........... | H01L 27/1225 257/40 |
| 2014/0140588 A1* | 5/2014 | Chou | ................... | G06K 9/0002 382/124 |
| 2015/0123125 A1* | 5/2015 | Yamazaki | ........... | H01L 27/1225 257/43 |
| 2015/0137149 A1* | 5/2015 | Urano | ..................... | H01L 33/58 257/88 |
| 2016/0322510 A1* | 11/2016 | Yamazaki | ........... | H01L 27/1225 |
| 2017/0083745 A1* | 3/2017 | Goodelle | ........... | G06K 9/00053 |
| 2017/0162620 A1* | 6/2017 | Wang | ................ | H01L 27/14618 |
| 2017/0162719 A1* | 6/2017 | Yamazaki | ......... | H01L 21/02554 |

FOREIGN PATENT DOCUMENTS

| | | |
|---|---|---|
| TW | 200641701 | 12/2006 |
| TW | 200644605 | 12/2006 |
| TW | 201101196 | 1/2011 |
| TW | I485629 | 5/2015 |
| TW | 201626516 | 7/2016 |
| TW | 201705031 | 2/2017 |

* cited by examiner

IMAGE CAPTURING MODULE AND ELECTRICAL APPARATUS

CROSS-REFERENCE TO RELATED APPLICATION

This application is a continuation-in-part application of and claims the priority benefit of a prior application Ser. No. 15/208,619, filed on Jul. 13, 2016, now pending. The prior application Ser. No. 15/208,619 is a continuation-in-part application of and claims the priority benefit of a prior application Ser. No. 14/835,130, filed on Aug. 25, 2015, now pending, which claims the priority benefits of Taiwan application serial no. 103129359, filed on Aug. 26, 2014. The prior application Ser. No. 15/208,619 is also a continuation-in-part application of and claims the priority benefit of a prior application Ser. No. 14/978,237, filed on Dec. 22, 2015, now allowed, which claims the priority benefits of Taiwan application serial no. 103144744, filed on Dec. 22, 2014. This application also claims the priority benefits of Taiwan application serial no. 105214737, filed on Sep. 26, 2016, and U.S. provisional application Ser. No. 62/486,954, filed on Apr. 18, 2017. The entirety of each of the above patent applications is hereby incorporated by reference herein and made a part of this specification.

BACKGROUND OF THE INVENTION

1. Field of the Invention

The invention relates to a photoelectronic module and an electrical apparatus using the photoelectronic module, and particularly relates to an image capturing module and an electrical apparatus using the image capturing module.

2. Description of Related Art

Biometric identification includes identifications based on face, sound, iris, retina, vein, palm print, fingerprint, and the like. Based on different principles of sensing, biometric feature identification apparatuses may be classified into optical, capacitive, ultrasonic, and thermal sensitive identification apparatuses. Generally speaking, an optical biometric feature identification apparatus includes a light source, a light guide, and a sensor. Light beams emitted by the light source are irradiated on an object to be identified pressing the light guide. The sensor receives light beams reflected by the object to be identified for biometric feature identification.

Taking fingerprint identification as an example, when a finger presses the light guide, peaks of a fingerprint contact the light guide, whereas troughs of the fingerprint do not contact the light guide. Hence, the peaks of the fingerprint may destruct the total internal reflection of the light beams in the light guide, so the sensor is able to obtain dark portions corresponding to the peaks. Meanwhile, the troughs of the fingerprint do not destruct the total internal reflection of the light beams in the light guide, so the sensor is able to obtain bright portions corresponding to the troughs. Accordingly, the light beams corresponding to the peaks and the troughs of the fingerprint form a strip pattern with interleaving parts differing in brightness on a light receiving surface of the sensor. An identity of the user is able to be identified by calculating information corresponding to a fingerprint image based on an algorithm.

Since the light source in the optical biometric feature identification apparatus is disposed beside the sensor, a light beam emitted at a greater angle by the light source may be directly emitted to the sensor and result in an optical interference. Thus, the capability of fingerprint identification may be affected.

SUMMARY OF THE INVENTION

The invention provides an image capturing module and an electrical apparatus having a preferable identification capability.

An image capturing module according to an embodiment of the invention is configured to identify a fingerprint pattern of a finger. The image capturing module includes a substrate, a plurality of light emitting devices, a sensor, and a transparent colloid curing layer. The light emitting devices are disposed on the substrate and electrically connected to the substrate. The sensor is disposed on the substrate and electrically connected to the substrate. The transparent colloid curing layer is disposed on the substrate and covers the sensor and the light emitting devices. At least one trench is formed on a surface of the transparent colloid curing layer opposite to the sensor. The at least one trench is located between the sensor and the light emitting devices, and a depth of the at least one trench is less than a thickness of the transparent colloid curing layer.

An electrical apparatus according to an embodiment of the invention includes an image capturing module, an infrared band-pass filter layer, and a display device. The image capturing module includes a substrate, a plurality of light emitting devices, a sensor, and a transparent colloid curing layer. The light emitting devices are disposed on the substrate and electrically connected to the substrate. The sensor is disposed on the substrate and electrically connected to the substrate. The transparent colloid curing layer is disposed on the substrate and covers the sensor and the light emitting devices. At least one trench is formed on a surface of the transparent colloid curing layer opposite to the sensor. The at least one trench is located between the sensor and the light emitting devices, and a depth of the at least one trench is less than a thickness of the transparent colloid curing layer. The infrared band-pass filter layer is disposed on the transparent colloid curing layer. The display device is disposed on the infrared band-pass filter layer.

Based on the above, in the image capturing module and the electrical apparatus according to the embodiments of the invention, the transparent colloid curing layer has at least one trench, and the at least one trench is located between the sensor and the light emitting devices. The at least one trench is able to prevent the light beams emitted by the light emitting devices from being directly irradiated on the sensor, so as to reduce the optical interference and facilitate the identification capability of the image capturing module.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
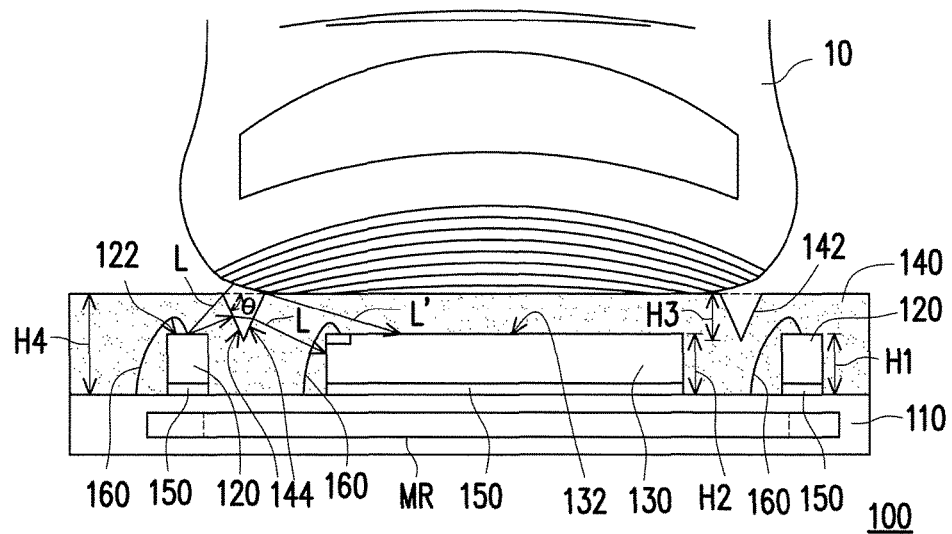
FIGS. 1A and 1B are respectively a schematic cross-sectional view and a schematic top view illustrating an image capturing module according to a first embodiment of the invention.

Reference will now be made in detail to the present preferred exemplary embodiments of the invention, examples of which are illustrated in the accompanying drawings. Wherever possible, the same reference numbers are used in the drawings and the description to refer to the same or like parts.

It is to be understood that both the foregoing and other detailed descriptions, features and advantages are intended to be described more comprehensively by providing respective embodiments accompanied with figures hereinafter. In the following embodiments, wordings used to indicate directions, such as "up," "down," "front," "back," "left," and "right", merely refer to directions in the accompanying drawings. Therefore, the directional wording is used to illustrate rather than limit the invention. Moreover, in the following embodiments, like or similar components are referred to by like or similar reference symbols.

Figure 1B:
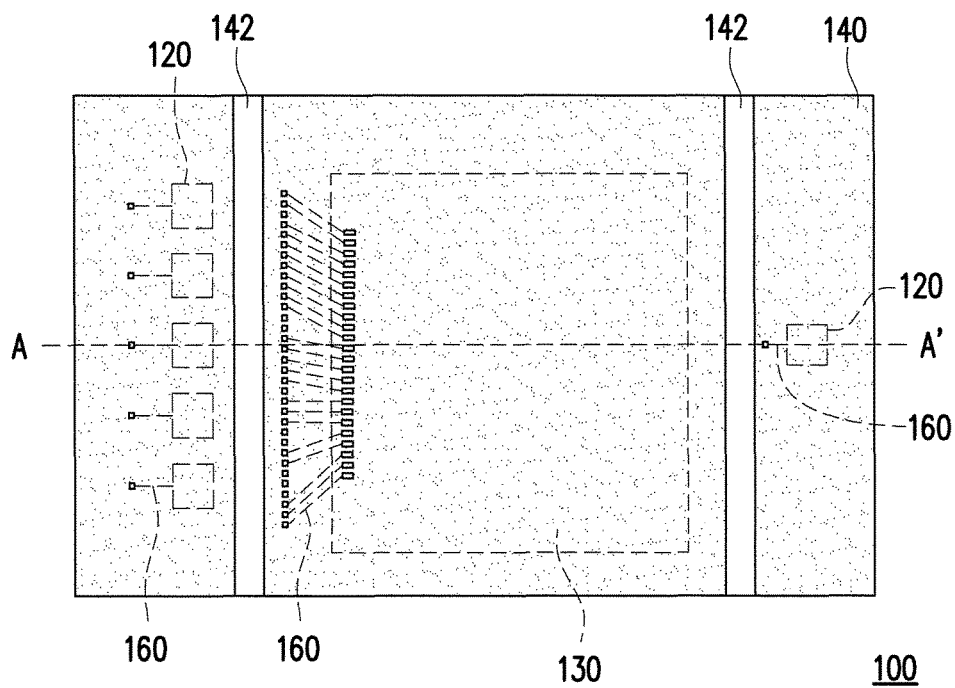

FIGS. 1A and 1B are respectively a schematic cross-sectional view and a schematic top view illustrating an image capturing module according to a first exemplary embodiment of the invention, wherein FIG. 1A is a schematic cross-sectional view taken along a sectional line A-A' of FIG. 1B. Referring to FIGS. 1A and 1B, an image capturing module 100 is adapted to capture a biometric feature of an object 10 to be sensed. In the exemplary embodiment, the object 10 to be sensed is a finger, for example, and the biometric feature is a fingerprint or a vein, for example. However, the invention is not limited thereto. For example, in another embodiment, the object 10 to be sensed may also be a palm, and the biometric feature may be a palm print.

The image capturing module 100 includes a substrate 110, a plurality of light emitting devices 120, a sensor 130, and a transparent colloid curing layer 140.

The substrate 110 serves as a carrier of these components, and circuits may be provided on the substrate 110. As examples, the substrate 110 may be a printed circuit board (PCB), a flexible PCB (FPCB), a glass carrier having circuits, or a ceramic substrate having circuits. However, the invention is not limited thereto.

In order to make a packaging structure of the image capturing module 100 more applicable, a metal ring MR may be disposed in the substrate 110. The metal ring MR is located between an upper surface and a lower surface of the substrate 110 and surrounds a sensing region of the sensor 130. Accordingly, when the object 10 to be sensed presses the transparent colloid curing layer 140, the apparatus may start operating through charging by induction. Also, the packaging structure of the image capturing module 100 may enter a temporarily suspended state when idling to save energy.

The light emitting devices 120 are disposed on the substrate 110 and electrically connected to the substrate 110. Each of the light emitting devices 120 has a light emitting surface 122. A light beam L is emitted from the light emitting surface 122 of each of the light emitting devices 120 toward the object 10 to be sensed. The light emitting devices 120 may include a light emitting diode, a laser diode, or a combination thereof. In addition, the light beam L may include visible light, invisible light, or a combination thereof. The invisible light may be infrared light. However, the invention is not limited thereto.

The sensor 130 is disposed on the substrate 110 and electrically connected to the substrate 110. In addition, the sensor 130 is disposed beside the light emitting devices 120 to receive portions (i.e., reflected light beams L' having fingerprint pattern information) of the light beams L reflected by the object 10 to be sensed. The sensor 130 is a charge coupled device (CCD), a complementary metal-oxide semiconductor (CMOS) device, or other suitable image sensing devices, for example.

In an exemplary embodiment, a pulse width modulation (PWM) circuit is integrated in the sensor 130. By configuring the pulse width modulation circuit to control a light emitting time of the light emitting devices 120 and an image capturing time of the sensor 130, the light emitting time of the light emitting devices 120 and the image capturing time of the sensor 130 are synchronized, thereby exerting accurate control. However, the invention is not limited thereto.

The transparent colloid curing layer 140 is disposed on the substrate 110 and covers the sensor 130 and the light emitting devices 120. The transparent colloid curing layer 140 is formed by curing a transparent colloid, such as silica gel, resin, optical adhesive, epoxy resin, or the like, by performing a thermal process or an irradiating process. Therefore, in addition to preventing electrostatic damages to protect the sensor 130 and the light emitting devices 120 covered by the transparent colloid curing layer 140, the transparent colloid curing layer 140 also allows the light beams L emitted by the light emitting devices 120 and the light beams L' reflected by the object 10 to be sensed to pass through.

At least one trench 142 is formed on a surface of the transparent colloid curing layer 140 opposite to the sensor 130. In addition, the at least one trench 142 is located between the sensor 130 and the light emitting devices 120. In the embodiment, the light emitting devices 120 are located at opposite sides of the sensor 130. In addition, the transparent colloid curing layer 140 includes two trenches 142. However, the invention is not limited thereto.

In the embodiment, a depth H3 of the trench 142 is less than a thickness H4 of the transparent colloid curing layer 140, namely H3<H4. In other words, for the ease of manufacturing, the trench 142 is not required to penetrate through the transparent colloid curing layer 140.

In the exemplary embodiment, each trench 142 is a strip-like V-shape trench. In addition, each trench 142 has two inclined surfaces 144. By adjusting a supplementary angle θ of an angle included between the inclined surface 144 of the two inclined surfaces 144 of the trench 142 that is closer to the corresponding light emitting devices 120 and the surface (e.g., a contact surface of the object 10 to be sensed) of the transparent colloid layer 140 opposite to the sensor 130, a desirable light utilization rate is rendered. For example, the supplementary angle θ is in a range from 30 degrees to 45 degrees, and a depth H3 of the at least one trench 142 is determined based on a size of the supplementary angle θ. In other exemplary embodiments, a cross-sectional shape of each trench 142 may also be a shape of an inverted trapezoid, an inverted semi-circular shape, or other shapes. The semi-circular shape generally refers to shapes of an incomplete circle, and is not limited to a half of a circle.

The V-shaped trench is able to change traveling paths of the light beams L. Specifically, when traveling to the inclined surface 144 of the trench 142 that is closer to the light emitting devices 120, the light beams L emitted by the light emitting devices 120 may enter the trench 142 (i.e., emitted out of the transparent colloid curing layer 140) through the inclined surface 144 that is closer to the light emitting devices 120. A portion of the light beams entering the trench 142 may enter the transparent colloid curing layer 140 again through the inclined surface 144 of the trench 142 that is closer to the sensor 130. With the V-shaped trench changing the traveling paths of the light beams L, the light beams L emitted by the light emitting devices 120 are prevented from being directly irradiated on the sensor 130. Accordingly, an optical interference or crosstalk on the sensor 130 is reduced, and an identification capability of the image capturing module 100 is facilitated.

In the exemplary embodiment, a light transmitting medium in the trench 142 is air. However, the invention is not limited thereto. In another embodiment, the trench 142 may be filled with a transparent material whose refractive index is greater than a refractive index of the transparent colloid curing layer 140, so as to more preferably prevent the light beams L emitted by the light emitting devices 120 from being directly irradiated on the sensor 130. The transparent material is a transparent material having a high refractive index, such as an optical adhesive curable by light or heat. However, the invention is not limited thereto.

Moreover, a height H2 of the sensor 130 may be less than a height H1 of the light emitting devices 120. In other words, the light emitting surfaces 122 of the light emitting devices 120 may be higher than a sensing surface 132 of the sensor 130 to further reduce the optical interference. The height H2 of the sensor 130 refers to a distance from the sensing surface 132 of the sensor 130 to the substrate 110, whereas the height H1 refers to a distance from the light emitting surfaces 122 of the light emitting devices 120 to the substrate 110.

One way to make the height H2 of the sensor 130 less than the height H1 of the light emitting devices 120 includes modifying thicknesses of the respective components (the sensor 130 and the light emitting devices 120). Alternatively, under a circumstance that another layer is disposed between the respective components and the substrate 110, a thickness of the another layer may be modified, so that the height H2 of the sensor 130 may be less than the height H1 of the light emitting devices 120. For example, the image capturing module 100 further includes a plurality of adhesive layers 150. The adhesive layers 150 may be disposed between the light emitting devices 120 and the substrate 110 and between the sensor 130 and the substrate 110. The adhesive layers 150 are adhesive colloids or double-sided tapes. A combined thickness of each of the light emitting devices 120 and the adhesive layer 150 below the light emitting device 120 is the height H1 of the light emitting device 120, whereas a combined thickness of the sensor 130 and the adhesive layer 150 below the sensor 130 is the height H2 of the sensor 130. By modifying the thickness of the adhesive layer 150 below each of the light emitting devices 120 and the thickness of the adhesive layer 150 below the sensor 130, the height H2 of the sensor 130 is set to be less than the height H1 of the light emitting device 120. However, in another embodiment, the height H2 of the sensor 130 may also be equal to or greater than the height H1 of the light emitting device 120.

In the embodiment, the image capturing module 100 further includes a plurality of connecting wires 160. The connecting wires 160 respectively connect the sensor 130 and the substrate 110 and connect the light emitting devices 120 and the substrate 110. Accordingly, the sensor 130 and the light emitting devices 120 are respectively electrically connected to the substrate 110. A material of the connecting wires 160 include gold, copper, or the like, for example. However, the invention is not limited thereto. In another embodiment, the sensor 130 and the light emitting devices 120 may also be respectively connected to the circuits on the substrate 110 through solder balls. The connecting wires 160 may be omitted accordingly.

The image capturing module 100 according to the embodiment may be manufactured according to the following. First of all, the light emitting devices 120 and the sensor 130 are adhered to the substrate 110 through the adhesive layers 150. In addition, the heights of the light emitting devices 120 and the sensor 130 may be modified by polishing. Then, the connecting wires 160 are formed on the substrate 110 by a wiring device. The connecting wires 160 are respectively connected to conductive pads of the light emitting devices 120 and a conductive pad of the substrate 110 and connected to a conductive pad of the sensor 130 and the conductive pad of the substrate 110. Then, a transparent colloid is formed on the substrate 110 by using a gluing device. In addition, the transparent colloid covers the light emitting devices 120, the sensor 130, and the connecting wires 160. Subsequently, the transparent colloid is cured by performing a thermal process (such as a baking process) or an irradiating process (such as an ultraviolet light curing process). Then, by performing an etching process, a laser engraving process, or any other suitable patterning process, the at least one trench 142 is formed on the surface of the cured transparent colloid opposite to the sensor 130. Accordingly, the transparent colloid curing layer 140 is formed. In other embodiments, the transparent colloid curing layer 140 and the at least one trench 142 may be integrally formed by using a mold. However, the invention is not limited thereto. In an embodiment, a plurality of image capturing units (including the light emitting devices 120, the sensor 130, and the transparent colloid curing layer 140) may be manufactured on the substrate 110 at the same time, and a plurality of the image capturing modules 100 may be formed by performing a cutting process.

Accordingly, the image capturing module 100 of the embodiment may be manufactured to be a fully planar fingerprint identification apparatus, thereby making the apparatus more compatible with other apparatuses in terms of assembling. Moreover, by applying a laminating and glue-injecting process, the image capturing module 100 according to the embodiment may be manufactured in mass production, so as to reduce the manufacturing cost. Moreover, since the trench 142 of the transparent colloid curing layer 142 is able to reduce the optical interference or crosstalk, a light shielding component may be omitted. As a consequence, the manufacturing process is simplified, the components required for manufacturing are reduced, and a module area may also be reduced.

Figure 2A:
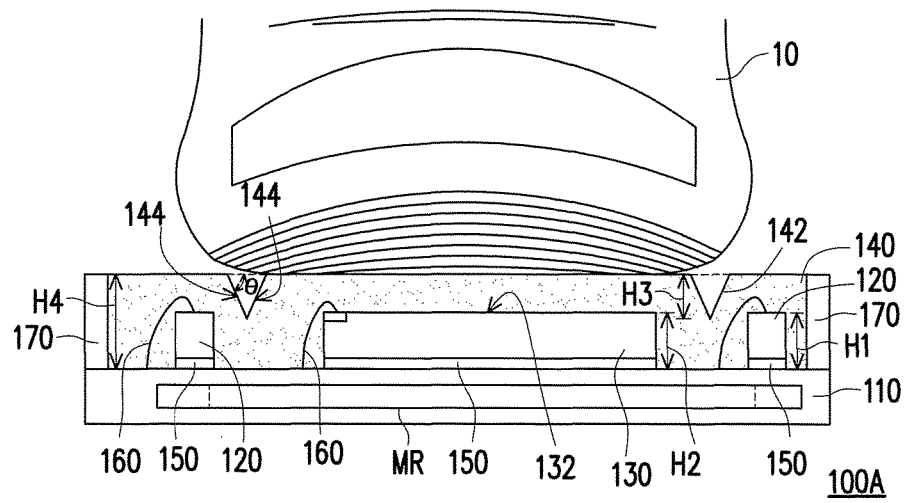
FIGS. 2A and 2B are respectively a schematic cross-sectional view and a schematic top view illustrating an image capturing module according to a second embodiment of the invention.
Figure 2B:
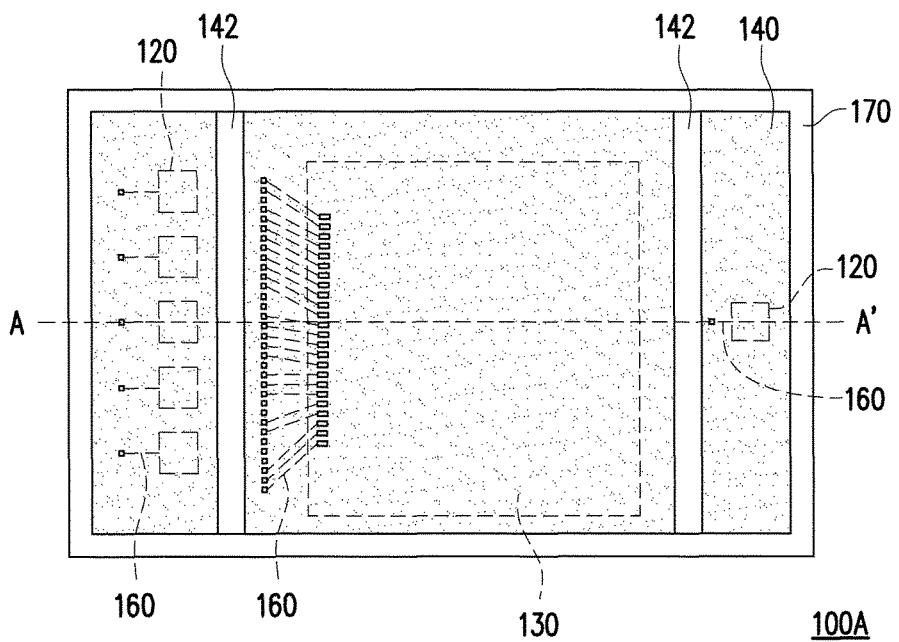

FIGS. 2A and 2B are respectively a schematic cross-sectional view and a schematic top view illustrating an image capturing module according to a second exemplary embodiment of the invention, wherein FIG. 2A is a schematic cross-sectional view taken along a sectional line A-A' of FIG. 2B. Referring to FIGS. 2A and 2B, an image capturing module 100A is similar to the image capturing module 100 of FIG. 1A. The main difference therebetween is described in the following. The image capturing module 100A further includes at least one wall structure 170. The at least one wall structure 170 surrounds the sensor 130 and the light emitting devices 120. In addition, a material of the at least one wall structure 170 may be the same or different from a material of the substrate 110. It should be noted that the invention does not intend to impose a limitation on this regard.

During the manufacturing, the wall structure 170 may be formed after the sensor 130 and the light emitting devices 120 are disposed and before the transparent colloid curing layer 140 is formed. Alternatively, the substrate 110 may be formed like a groove, and a protruding portion on an edge of the groove serves as the wall structure 170. In other words, the at least one wall structure 170 and the substrate 110 may be integrally formed. Disposing the at least one wall structure 170 reduces breakage of the connecting wires 160 or dislocation and thus malfunctioning of the sensor 130 due to an increased gluing pressure when the transparent colloid is injected. Accordingly, a yield of the image capturing module 100A is increased. In addition, a preferable structural strength of the image capturing module 100A is also rendered. In an embodiment, the wall structure 170 may be removed by performing a cutting process after the transparent colloid curing layer 140 is formed. Accordingly, the image capturing module 100 shown in FIG. 1A is formed.

Figure 3:
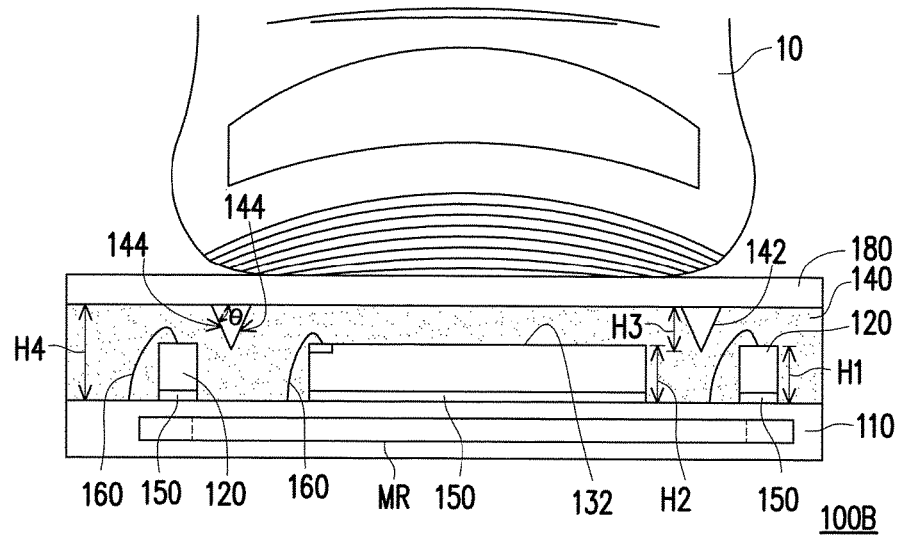
FIG. 3 is a schematic cross-sectional view illustrating an image capturing module according to a third embodiment of the invention.

FIG. 3 is a schematic cross-sectional view illustrating an image capturing module according to a third embodiment of the invention. Referring to FIG. 3, an image capturing module 100B is similar to the image capturing module 100 of FIG. 1A. The main difference therebetween is described in the following. The image capturing module 100B further includes a cover plate 180. The cover plate 180 is disposed on the transparent colloid curing layer 140 and covers the at least one trench 142. In addition, the light transmitting medium in the at least one trench 142 includes air. A material of the cover plate 180 includes glass or a transparent plastic material, for example. In an embodiment, the cover plate 180 may be attached to the transparent colloid curing layer 140 through an adhesive layer (not shown). The adhesive layer may be an adhesive colloid or a double-sided tape. Accordingly, an ability to block moisture is further reinforced and internal components in the image capturing module 100B is protected. For example, the transparent colloid curing layer 140 may be prevented from scratches. In another embodiment, the cover plate 180 may be further fixed onto the transparent colloid curing layer 140 by a fixing device. Accordingly, the adhesive layer may be omitted.

Under the configuration of FIG. 3, the image capturing module 100B may further include the wall structure 170 of FIG. 2A. Relevant descriptions may be referred to the previous paragraphs and shall not be repeated in the following.

Figure 4:
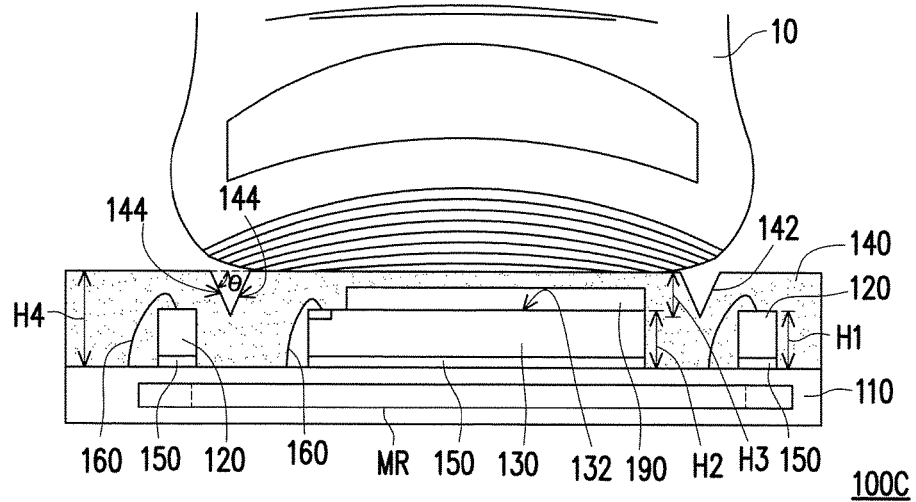
FIG. 4 is a schematic cross-sectional view illustrating an image capturing module according to a fourth embodiment of the invention.

FIG. 4 is a schematic cross-sectional view illustrating an image capturing module according to a fourth embodiment of the invention. Referring to FIG. 4, an image capturing module 100C is similar to the image capturing module 100 of FIG. 1A. The main difference therebetween is described in the following. The image capturing module 100C further includes an optical collimator 190. The optical collimator 190 is disposed on the sensor 130 and located between the transparent colloid curing layer 140 and the sensor 130 to collimate the light beams transmitted to the sensor 130. As examples, a pinhole collimator or a fiber collimator may be chosen as the optical collimator 190. Accordingly, a light intensity of the light beams reflected by the object to be sensed and then sensed by the sensor 130 is increased, and an identification rate of the image capturing module 100C is thus increased.

Under the configuration of FIG. 4, the image capturing module 100C may further include the wall structure 170 of FIG. 2A or the cover plate 180 of FIG. 3. Relevant descriptions may be referred to the previous paragraphs and shall not be repeated in the following.

Figure 5:
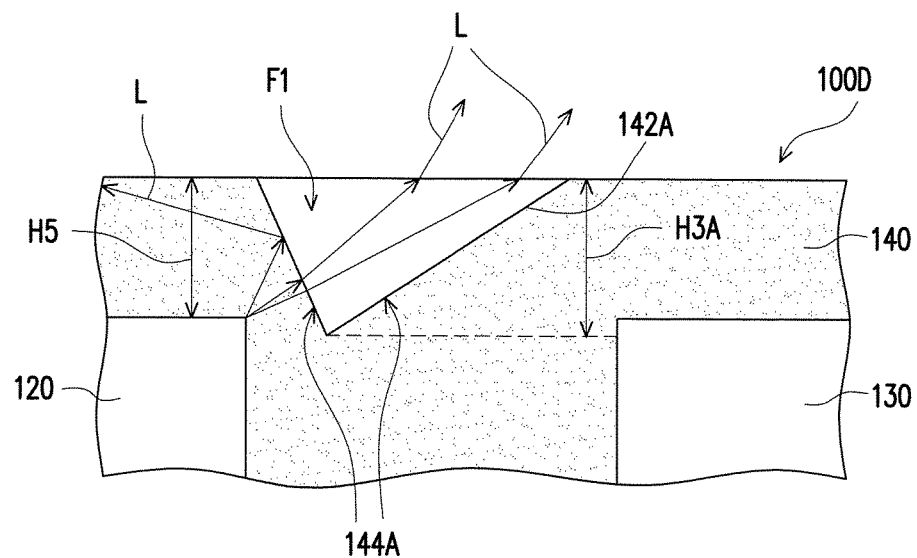
FIG. 5 is another schematic cross-sectional view illustrating a trench of an image capturing module according to the invention.

FIG. 5 is another schematic cross-sectional view illustrating a trench of an image capturing module according to the invention. Referring to FIG. 5, an image capturing module 100D is similar to the image capturing module 100 of FIG. 1A. The main difference therebetween is described in the following. In the image capturing module 100D, degrees of two vertex angles of a trench 142A are different. For example, a supplementary angle of an angle included between an inclined surface 144A of the two inclined surfaces 144A that is closer to the corresponding light emitting devices 120 and the surface of the transparent colloid curing layer 140 opposite to the sensor 130 is 66.8 degrees, whereas a supplementary angle of an angle included between the inclined surface 144A of the two inclined surfaces 144A that is closer to the sensor 130 and the surface of the transparent colloid curing layer 140 opposite to the sensor 130 is 32.5 degrees, and a base angle of the trench 142A is 90 degrees. In other embodiments, the degrees of the two vertex angles of the trench 142A may be exchanged or modified based on the design, and it should be understood that the invention is not limited thereto. In addition, a depth H3A of the trench 142A is determined by the angles. In the embodiment, the depth H3A of the trench 142A is greater than a distance H5 from the light emitting surfaces of the respective light emitting devices 120 to the surface of the transparent colloid curing layer 140 opposite to the sensor 130. However, the invention is not limited thereto.

In the exemplary embodiment, the trench 142A is filled with a transparent material F1, and a refractive index of the transparent material F1 is greater than a refractive index of the transparent colloid curing layer 140. Therefore, when the light beams L emitted by the light emitting devices 120 are transmitted to the trench 142A, a portion of the light beams L may undergo total internal reflection by the inclined surface 144A closer to the light emitting devices 142A, and another portion of the light beams L may pass through the inclined surface 144A closer to the light emitting devices 120 and be transmitted in a direction away from the sensor 130. Accordingly, the light beams L emitted by the light emitting devices 120 may be prevented from being directly irradiated on the sensor 130, so as to reduce the optical interference or crosstalk.

Figure 6:
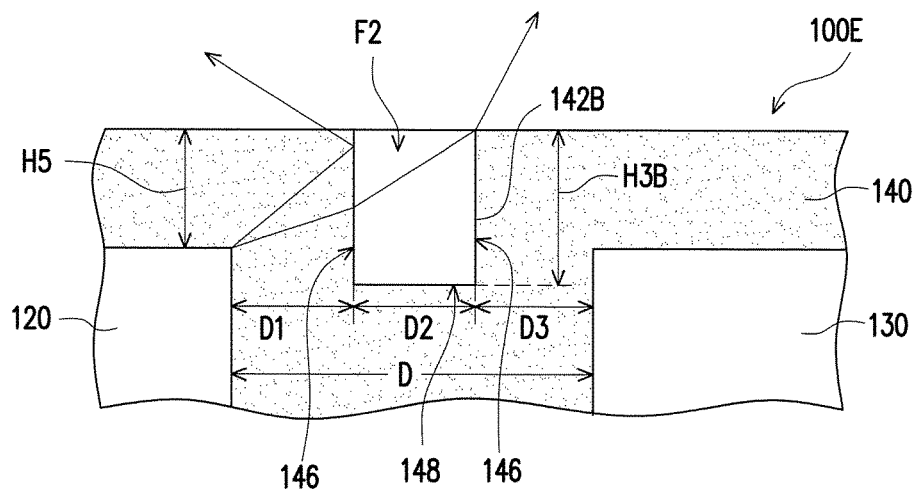
FIG. 6 is yet another schematic cross-sectional view illustrating a trench of an image capturing module according to the invention.

FIG. 6 is yet another schematic cross-sectional view illustrating a trench of an image capturing module according to the invention. Referring to FIG. 6, an image capturing module 100E is similar to the image capturing module 100 of FIG. 1A. The main difference therebetween is described in the following. In the image capturing module 100E, a trench 142B is a U-shaped trench. Specifically, the trench 142B has two side surfaces 146 opposite to each other and a bottom surface 148. Based on different manufacturing processes, the bottom surface 148 may be a planar surface, an inclined surface, or a curved surface.

In addition to changing the traveling paths of the light beams through refraction, with the side surface 146 closer to the light emitting devices 120, the U-shaped trench also enables total internal reflection of light beams transmitted to the side surface 146, so that the light beams are transmitted in a direction away from the sensor 130. In the embodiment, a depth H3B of the trench 142B is greater than the distance H5 from the light emitting surfaces of the respective light emitting devices 120 to the surface of the transparent colloid curing layer 140 opposite to the sensor 130. Therefore, most of the light beams transmitted to the side surface 146 of the trench 142B that is closer to the light emitting devices 120 undergo the total internal reflection and are transmitted in a direction away from the sensor 130.

In an exemplary embodiment, a width D2 of the trench 142B (such as the width D2 of the bottom surface 148), a distance D1 from one of the light emitting devices 120 corresponding to the trench 142B to the trench 142B, and a distance D3 from the sensor 130 to the trench 142B are all one-third of a distance D from the one of the corresponding light emitting devices 120 to the sensor 130. However, the invention is not limited thereto.

In the embodiment, the trench 142B is filled with a transparent material F2. A refractive index of the transparent material F2 is less than the refractive index of the transparent colloid curing layer 140, so as to generate the total internal reflection. However, in other embodiments, the transparent material F2 may be omitted.

Figure 7A:
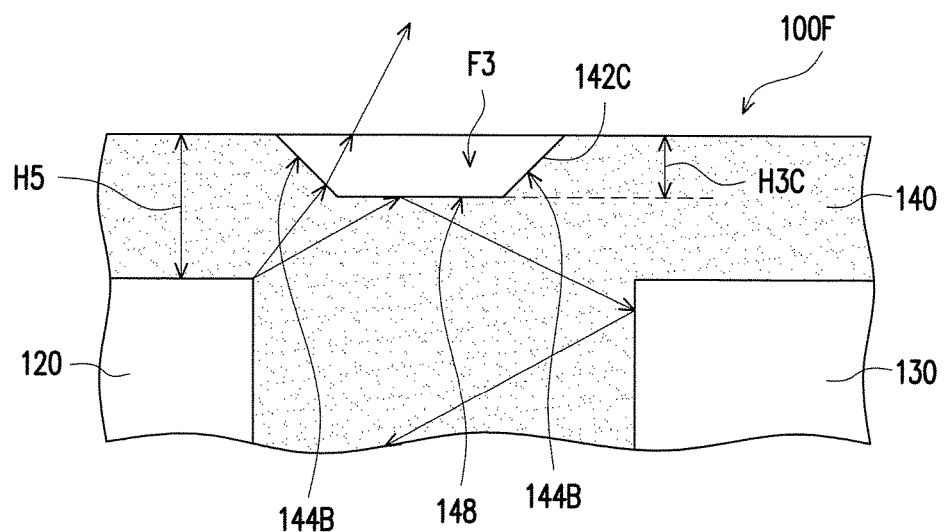
FIGS. 7A to 7B are still another two schematic cross-sectional views respectively illustrating a trench of an image capturing module according to the invention.
Figure 7B:
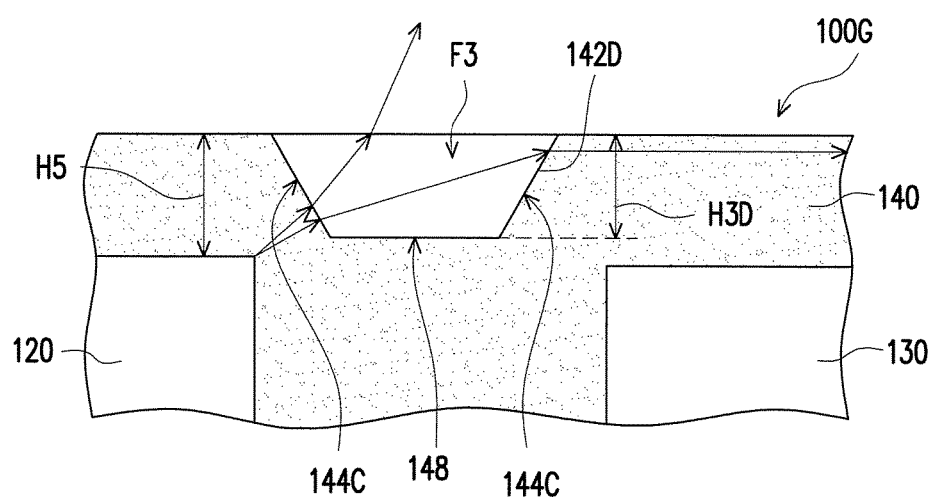

FIGS. 7A to 7B are still another two schematic cross-sectional views respectively illustrating a trench of an image capturing module according to the invention. Referring to FIGS. 7A and 7B, an image capturing module 100F and an image capturing module 100G are similar to the image capturing module 100 of FIG. 1A. The main difference therebetween is described in the following. In the image capturing modules 100F and 100G, trenches 142C and 142D are in shapes of inverted trapezoids. Specifically, the trench 142C (or the trench 142D) has two inclined surfaces 144B (or two inclined surfaces 144C) and the bottom surface 148. In the embodiments, the inverted trapezoids as the shapes of the image capturing modules 100F and the image capturing module 100G are inverted isosceles trapezoids. However, the invention is not limited thereto.

In addition to changing the traveling paths of the light beams through refraction, with the inclined surface 144B (or the inclined surface 144C) closer to the light emitting devices, the trenches in the shapes of inverted trapezoids also enable total internal reflection of the light beams transmitted to the inclined surface 144B (or the inclined surface 144C), so that the light beams are not directly emitted to the sensing surface of the sensor 130. In the image capturing modules 100F and 100G, depths H3C and H3D of the trenches 142C and 142D are less than the distance H5 from the light emitting surfaces of the respective light emitting devices 120 to the surface of the transparent colloid curing layer 140 opposite to the sensor 130. Therefore, most of the light beams transmitted to the bottom surfaces 148 of the trenches 142C and 142D are redirected through the total internal reflection at the bottom surface and are not directly emitted to the sensing surface of the sensor 130 (as shown in FIG. 7A).

In the embodiment, the trenches 142C and 142D are filled with a transparent material F3. In addition, a refractive index of the transparent material F3 is less than a refractive index of the transparent colloid curing layer 140, so as to generate the total internal reflection.

Figure 8:
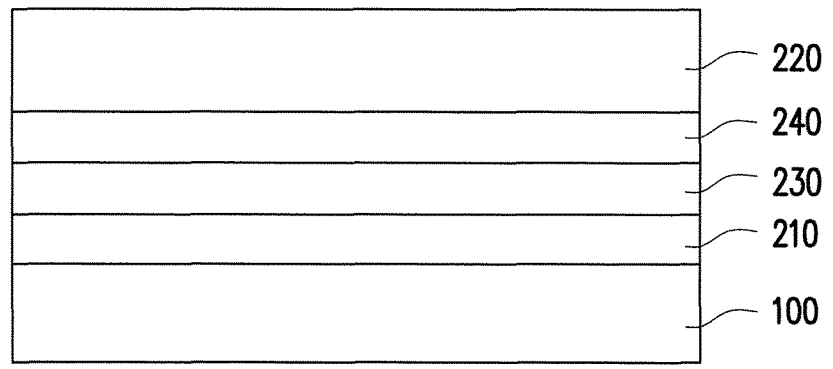
FIG. 8 is a schematic view illustrating an electrical apparatus according to an embodiment of the invention.

FIG. 8 is a schematic view illustrating an electrical apparatus according to an embodiment of the invention. Referring to FIGS. 1A and 8, an electrical apparatus 200 includes the image capturing module 100, an infrared band-pass filter layer 210, and a display device 220. The image capturing module 100 shown in FIG. 1A may be chosen as the image capturing module 100. Therefore, details about the structure and implementation of the image capturing module will not be repeated in the following. In other embodiments, the image capturing module 100 may also be replaced by the image capturing modules described in other embodiments.

In the embodiment, the light emitting devices in the image capturing module 100 are infrared light emitting devices, such as infrared light emitting diodes (IR-LEDs). The infrared band-pass filter layer 210 is disposed on the image capturing module 100 (e.g., located on the transparent colloid curing layer 140 of FIG. 1A), and is configured for the light beams L emitted by the respective light emitting devices 120 and the portions (i.e., the reflected light beams L' shown in FIG. 1A) of the light beams L reflected by the object 10 to be sensed to pass through.

Figure 9:
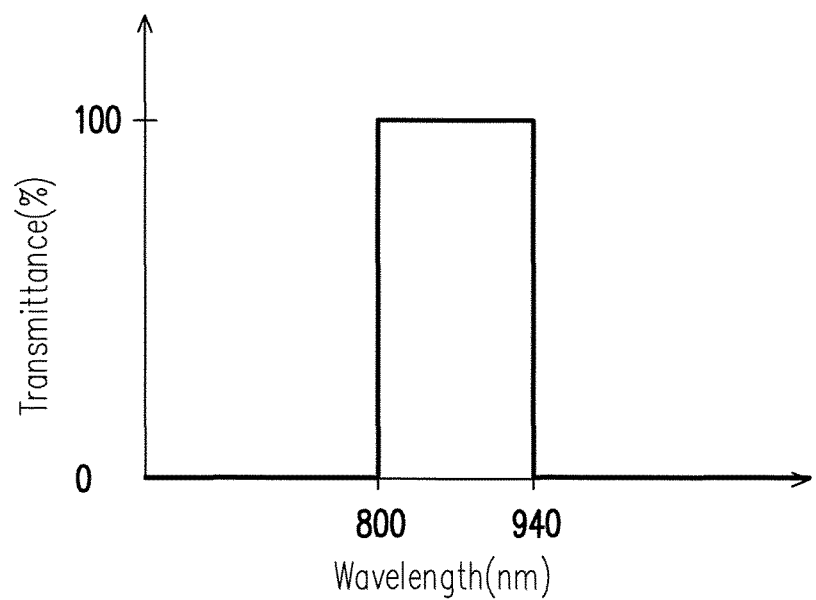
FIG. 9 is a schematic diagram illustrating a wavelength-transmittance relation of an infrared band-pass filter layer according to an embodiment of the invention.

FIG. 9 is a schematic diagram illustrating a wavelength-transmittance relation of an infrared band-pass filter layer according to an embodiment of the invention. Referring to FIGS. 8 and 9 together, in the embodiment, the infrared band-pass filter layer 210 allows a light beam whose wavelength is in a range from 800 nm to 940 nm (a waveband of infrared light) to pass through and filters out a light beam whose wavelength is not in the range from 800 nm to 940 nm. In other embodiments, the infrared band-pass filter layer 210 allowing a light beam whose wavelength is in a range from 840 nm to 860 nm or in a range from 900 nm to 940 nm to pass through may be chosen. However, the invention is not limited thereto. By disposing the infrared band-pass filter layer 210, light beams in other wavebands (e.g., a waveband of visible light) may be prevented from being transmitted to the sensor 130. Accordingly, an interference or crosstalk of ambient light is reduced, and an identification capability of the electrical apparatus 200 may be facilitated.

Referring to FIG. 8, the display device 220 is disposed on the infrared band-pass filter layer 210. The display device 220 may be a thin film transistor liquid crystal display (TFT-LCD), a micro light emitting diode (micro LED) display, or an organic light emitting diode (OLED) display. However, the invention is not limited thereto.

In addition, the electrical apparatus 200 may optionally include a hard coating layer 230 disposed on the infrared band-pass filter layer 210 to protect the infrared band-pass filter layer 210 and thus make the electrical apparatus 200 more durable. Besides, the display device 220 may be adhered onto the hard coating layer 230 through an adhesive layer 240.

In view of the foregoing, in the image capturing module and the electrical apparatus according to the embodiments of the invention, the transparent colloid curing layer has at least one trench, and the at least one trench is located between the sensor and the light emitting devices. The at least one trench is able to prevent the light beams emitted by the light emitting devices from being directly irradiated on the sensor, so as to reduce the optical interference and facilitate the identification capability of the image capturing module. In an embodiment, the image capturing module may be manufactured as a fully planar fingerprint identification apparatus, thereby making the apparatus more compatible with other apparatuses in terms of assembling. Moreover, by applying the laminating and glue-injecting process, the image capturing module may be manufactured in mass production, so as to reduce the manufacturing cost. Furthermore, since the at least one trench of the transparent colloid curing layer is able to reduce the optical interference, a light shielding component is omitted. Accordingly, the manufacturing process is simplified, the components required for manufacturing are reduced, and the module area may also be reduced. In another embodiment, the image capturing module may further include the cover plate to further block moisture and protect the internal components in the image capturing module. In yet another embodiment, the image capturing module may further include the optical collimator to increase the light intensity of the light beams reflected by the object to be sensed and sensed by the sensor, and the identification rate of the image capturing module is thus increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An image capturing module, comprising:
   a substrate;
   a plurality of light emitting devices, disposed on the substrate and electrically connected to the substrate;
   a sensor, disposed on the substrate and electrically connected to the substrate; and
   a transparent colloid curing layer, disposed on the substrate and covering the sensor and the light emitting devices, wherein at least one trench is formed on a surface of the transparent colloid curing layer opposite to the sensor, the at least one trench is located between the sensor and the light emitting devices, and a depth of the at least one trench is less than a thickness of the transparent colloid curing layer.

2. The image capturing module as claimed in claim 1, further comprising:
   a plurality of adhesive layers, respectively disposed between the light emitting devices and the substrate and between the sensor and the substrate.

3. The image capturing module as claimed in claim 1, wherein the at least one trench has two inclined surfaces, and a supplementary angle of an angle included between one of the two inclined surfaces that is closer to the corresponding light emitting devices and the surface of the transparent colloid curing layer opposite to the sensor is in a range from 30 degrees to 45 degrees.

4. The image capturing module as claimed in claim 3, wherein the at least one trench is a V-shaped trench, the at least one trench is filled with a transparent material, and a refractive index of the transparent material is greater than a refractive index of the transparent colloid curing layer.

5. The image capturing module as claimed in claim 1, wherein the at least one trench is a U-shaped trench, the depth of the at least one trench is greater than a distance from light emitting surfaces of the respective light emitting devices to the surface of the transparent colloid curing layer opposite to the sensor.

6. The image capturing module as claimed in claim 5, wherein a width of the at least one trench, a distance from one of the light emitting devices corresponding to the at least one trench to the at least one trench, and a distance from the sensor to the at least one trench are all one third of a distance from the one of the light emitting devices corresponding to the at least one trench to the sensor.

7. The image capturing module as claimed in claim 1, wherein the at least one trench is in a shape of an inverted trapezoid, the depth of the at least one trench is less than a distance from light emitting surfaces of the respective light emitting devices to the surface of the transparent colloid curing layer opposite to the sensor.

8. The image capturing module as claimed in claim 1, wherein the at least one trench is a U-shaped trench or a trench in a shape of an inverted trapezoid, the at least one trench is filled with a transparent material, and a refractive index of the transparent material is less than a refractive index of the transparent colloid curing layer.

9. The image capturing module as claimed in claim 1, further comprising:
   an optical collimator, disposed on the sensor and located between the transparent colloid curing layer and the sensor.

10. The image capturing module as claimed in claim 1, further comprising:
    a plurality of connecting wires, respectively connecting the sensor and the substrate and connecting the light emitting devices and the substrate; and
    at least one wall structure, surrounding the sensor and the light emitting devices.

11. The image capturing module as claimed in claim 1, further comprising:
    a cover plate, disposed on the transparent colloid curing layer and covering the at least one trench, wherein a light transmitting medium in the at least one trench includes air.

12. The image capturing module as claimed in claim 1, wherein the substrate has a metal ring located between an upper surface and a lower surface of the substrate and surrounding a sensing region of the sensor.

13. An electrical apparatus, comprising:
    an image capturing module, comprising:
      a substrate;
      a plurality of light emitting devices, disposed on the substrate and electrically connected to the substrate;
      a sensor, disposed on the substrate and electrically connected to the substrate; and
      a transparent colloid curing layer, disposed on the substrate and covering the sensor and the light emitting devices, wherein at least one trench is formed on a surface of the transparent colloid curing layer opposite to the sensor, the at least one trench is located between the sensor and the light emitting devices, and a depth of the at least one trench is less than a thickness of the transparent colloid curing layer;
    an infrared band-pass filter layer, disposed on the transparent colloid curing layer; and a display device, disposed on the infrared band-pass filter layer.

14. The electrical apparatus as claimed in claim 13, wherein the image capturing module further comprises a plurality of adhesive layers, and the adhesive layers are respectively disposed between the light emitting devices and the substrate and between the sensor and the substrate.

15. The electrical apparatus as claimed in claim 13, wherein the at least one trench has two inclined surfaces, and a supplementary angle of an angle included between one of the two inclined surfaces that is closer to the corresponding light emitting devices and the surface of the transparent colloid curing layer opposite to the sensor is in a range from 30 degrees to 45 degrees.

16. The electrical apparatus as claimed in claim 15, wherein the at least one trench is a V-shaped trench, the at least one trench is filled with a transparent material, and a refractive index of the transparent material is greater than a refractive index of the transparent colloid curing layer.

17. The electrical apparatus as claimed in claim 13, wherein the at least one trench is a U-shaped trench, the depth of the at least one trench is greater than a distance from light emitting surfaces of the respective light emitting devices to the surface of the transparent colloid curing layer opposite to the sensor.

18. The electrical apparatus as claimed in claim 17, wherein a width of the at least one trench, a distance from one of the light emitting devices corresponding to the at least one trench to the at least one trench, and a distance from the sensor to the at least one trench are all one third of a distance from the one of the light emitting devices corresponding to the at least one trench to the sensor.

19. The electrical apparatus as claimed in claim 13, wherein the at least one trench is in a shape of an inverted trapezoid, the depth of the at least one trench is less than a distance from light emitting surfaces of the respective light emitting devices to the surface of the transparent colloid curing layer opposite to the sensor.

20. The electrical apparatus as claimed in claim 13, wherein the at least one trench is a U-shaped trench or a trench in a shape of an inverted trapezoid, the at least one trench is filled with a transparent material, and a refractive index of the transparent material is less than a refractive index of the transparent colloid curing layer.

21. The electrical apparatus as claimed in claim 13, wherein the image capturing module further comprises an optical collimator disposed on the sensor and located between the transparent colloid curing layer and the sensor.

22. The electrical apparatus as claimed in claim 13, wherein the image capturing module further comprises a plurality of connecting wires and at least one wall structure, the connecting wires respectively connect the sensor and the substrate and connect the light emitting devices and the substrate, and the at least one wall structure surrounds the sensor and the light emitting devices.

23. The electrical apparatus as claimed in claim 13, wherein the light emitting devices are infrared light emitting devices.

24. The electrical apparatus as claimed in claim 13, further comprising:
a hard coating layer, disposed between the display device and the infrared band-pass filter layer.

25. The electrical apparatus as claimed in claim 13, wherein the infrared band-pass filter layer allows a light beam whose wavelength is within a range from 800 nm to 940 nm to pass through, and filters out a light beam whose wavelength is not within the range from 800 nm to 940 nm.

26. The electrical apparatus as claimed in claim 13, wherein the substrate has a metal ring located between an upper surface and a lower surface of the substrate and surrounding a sensing region of the sensor.

* * * * *